(12) United States Patent
Lee

(10) Patent No.: US 10,067,541 B2
(45) Date of Patent: Sep. 4, 2018

(54) ELECTRONIC DEVICE AND CASE ASSEMBLING METHOD FOR ELECTRONIC DEVICE

(71) Applicant: Synology Inc., Taipei (TW)

(72) Inventor: Cheng-Huang Lee, Taipei (TW)

(73) Assignee: SYNOLOGY INC., Taipei (TW)

( * ) Notice: Subject to any disclaimer, the term of this patent is extended or adjusted under 35 U.S.C. 154(b) by 0 days.

(21) Appl. No.: 15/684,160

(22) Filed: Aug. 23, 2017

(65) Prior Publication Data

US 2018/0164858 A1    Jun. 14, 2018

(30) Foreign Application Priority Data

Dec. 9, 2016   (TW) .............................. 105140792 A

(51) Int. Cl.
| | |
|---|---|
| G06F 1/18 | (2006.01) |
| H05K 7/14 | (2006.01) |
| H05K 5/04 | (2006.01) |
| H05K 5/02 | (2006.01) |

(52) U.S. Cl.
CPC ........... *G06F 1/181* (2013.01); *H05K 5/0239* (2013.01); *H05K 5/04* (2013.01); *H05K 7/14* (2013.01)

(58) Field of Classification Search
CPC combination set(s) only.
See application file for complete search history.

(56) References Cited

U.S. PATENT DOCUMENTS

| | | | | |
|---|---|---|---|---|
| 4,479,198 A | * | 10/1984 | Romano | G06F 1/18 361/679.33 |
| 4,692,838 A | * | 9/1987 | Merchant | H02B 1/40 16/361 |
| 4,715,385 A | * | 12/1987 | Cudahy | A61B 5/0205 600/523 |
| 5,600,538 A | * | 2/1997 | Xanthopoulos | G06F 1/181 361/679.46 |
| 6,654,236 B2 | * | 11/2003 | Chen | G06F 1/181 292/80 |
| 6,698,853 B2 | * | 3/2004 | Chen | A47B 47/03 292/202 |
| 6,753,473 B2 | * | 6/2004 | Barlian | H02B 1/28 174/50 |
| 7,265,986 B2 | * | 9/2007 | Chen | G06F 1/181 361/726 |
| 7,433,176 B2 | * | 10/2008 | Kyle | H05K 7/1487 29/521 |

(Continued)

FOREIGN PATENT DOCUMENTS

CN           1952845 A       4/2007

*Primary Examiner* — Lisa Lea Edmonds
(74) *Attorney, Agent, or Firm* — McClure, Qualey & Rodack, LLP

(57) ABSTRACT

An electronic device is provided. The electronic device includes a supporting member, a case, at least two positioning structures, a guiding structure, and a protrusion. The two positioning structures are respectively disposed on the supporting member and the case, and are configured to facilitate assembly of the case and the supporting member. The guiding structure is disposed on the supporting member. The protrusion is disposed on the case. The protrusion is guided by the guiding structure so as to simplify the assembly process and improve the efficiency of assembly.

20 Claims, 9 Drawing Sheets

(56) References Cited

U.S. PATENT DOCUMENTS

| | | | | |
|---|---|---|---|---|
| 7,436,653 | B2* | 10/2008 | Yang | H04M 1/0202 |
| | | | | 361/679.01 |
| 7,484,818 | B2* | 2/2009 | Cheng | G06F 1/181 |
| | | | | 312/223.2 |
| 7,719,856 | B2* | 5/2010 | Nelson | E05D 1/04 |
| | | | | 361/755 |
| 7,733,635 | B2* | 6/2010 | Sullivan | G06F 1/1601 |
| | | | | 361/679.01 |
| 8,210,578 | B2* | 7/2012 | Tang | G06F 1/181 |
| | | | | 292/171 |
| 8,247,690 | B2* | 8/2012 | Wang | G06F 1/181 |
| | | | | 174/50 |
| 8,456,814 | B2* | 6/2013 | Gerovac | H02B 1/38 |
| | | | | 174/50 |
| 8,950,790 | B2* | 2/2015 | Zeng | G06F 1/181 |
| | | | | 292/32 |
| 9,750,145 | B2* | 8/2017 | Little | H05K 5/0026 |
| 2010/0091454 | A1* | 4/2010 | Degner | G06F 1/1616 |
| | | | | 361/679.58 |
| 2012/0236478 | A1* | 9/2012 | Shi | H01M 2/1066 |
| | | | | 361/679.01 |
| 2013/0141831 | A1* | 6/2013 | Lee | H01H 50/021 |
| | | | | 361/206 |

* cited by examiner

ELECTRONIC DEVICE AND CASE ASSEMBLING METHOD FOR ELECTRONIC DEVICE

CROSS REFERENCE TO RELATED APPLICATIONS

This application claims priority of Taiwan Patent Application No. 105140792, filed on Dec. 9, 2016, the entirety of which is incorporated by reference herein.

BACKGROUND

Technical Field

The present disclosure relates to an electronic device, and more particularly to the positioning of a case and an internal supporting structure for the electronic device during the assembly process.

Description of the Related Art

Generally, electronic devices have a case that accommodates various electronic elements. For example, a plurality of storage units (such as disk drives, hard disk drives (HDDs), solid state drives (SSDs), disk rewriters) are usually disposed in the case and are coupled to the socket that is disposed in the case. Those storage units are used for processing the calculation of huge amounts of data in computer servers.

Since case structures currently lack positioning elements, plenty of time is required to complete the process of assembling the case. Moreover, for a case having a snap-fit structure to affix the case to the chassis, extra external force is required to exert strain on the case so as to fit it to the chassis. Such an assembly process is not easy to conduct. Improper external forces may result in the case being fractured or distorted permanently.

Therefore, how to rapidly assemble the case structure of electronic devices while solving the above problems in the art is indeed an issue that is worth further study.

SUMMARY

One object of the disclosure is to provide an electronic device where the case assembly can be conducted easily and rapidly.

In accordance with some embodiments of the disclosure, the above electronic device includes a supporting member, a side cover, and a protrusion. The supporting member includes a first positioning structure and a guiding structure. The guiding structure is positioned on one side of the first positioning structure and has a slot. The side cover is positioned on one side of the supporting member and includes a second positioning structure, wherein at least a portion of the first positioning structure is disposed relative to the second positioning structure. The protrusion is disposed on the side cover and located within the slot, wherein the protrusion and an edge of the side cover are spaced apart by a first distance. An opening of the slot and an orthogonal projection of the edge of the side cover on the supporting member are spaced apart by a second distance, wherein the first distance is shorter than the second distance.

In accordance with some embodiments of the disclosure, the above electronic device includes a supporting member, a first positioning structure, a guiding structure, a side cover, a second positioning structure and a protrusion. A first positioning structure is disposed on the supporting member. The guiding structure is disposed on the supporting member and positioned on one side of the first positioning structure. The guiding structure has an askew segment and a slot, wherein the askew segment extends in a guiding direction, and an opening of the slot is positioned in the guiding direction. The side cover is positioned on one side of the supporting member. The second positioning structure is disposed on the side cover, wherein at least a portion of the first positioning structure is disposed relative to the second positioning structure. The protrusion is disposed on the side cover and positioned within the slot.

In accordance with some embodiments of the disclosure, a method for assembling a case of an electronic device is provided, wherein the electronic device includes a supporting member and the case includes a side cover. The above method for assembling the case includes moving the side cover along a first direction so that a second positioning structure which is disposed on the side cover is against a first positioning structure on the supporting member; continuously moving the side cover along the first direction so that a protrusion disposed on the side cover is against a guiding structure on the supporting member, and moving the side cover toward a second direction until the protrusion which is stopped at a position outside a slot of the guiding structure, and wherein the second direction is away from the first direction; and moving the side cover along a third direction so that the protrusion is moved within the slot, wherein the third direction is at least partially opposite the second direction.

A detailed description is given in the following embodiments with reference to the accompanying drawings.

BRIEF DESCRIPTION OF THE DRAWINGS

The disclosure may be more fully understood by reading the subsequent detailed description and examples with references made to the accompanying drawings. It should be noted that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
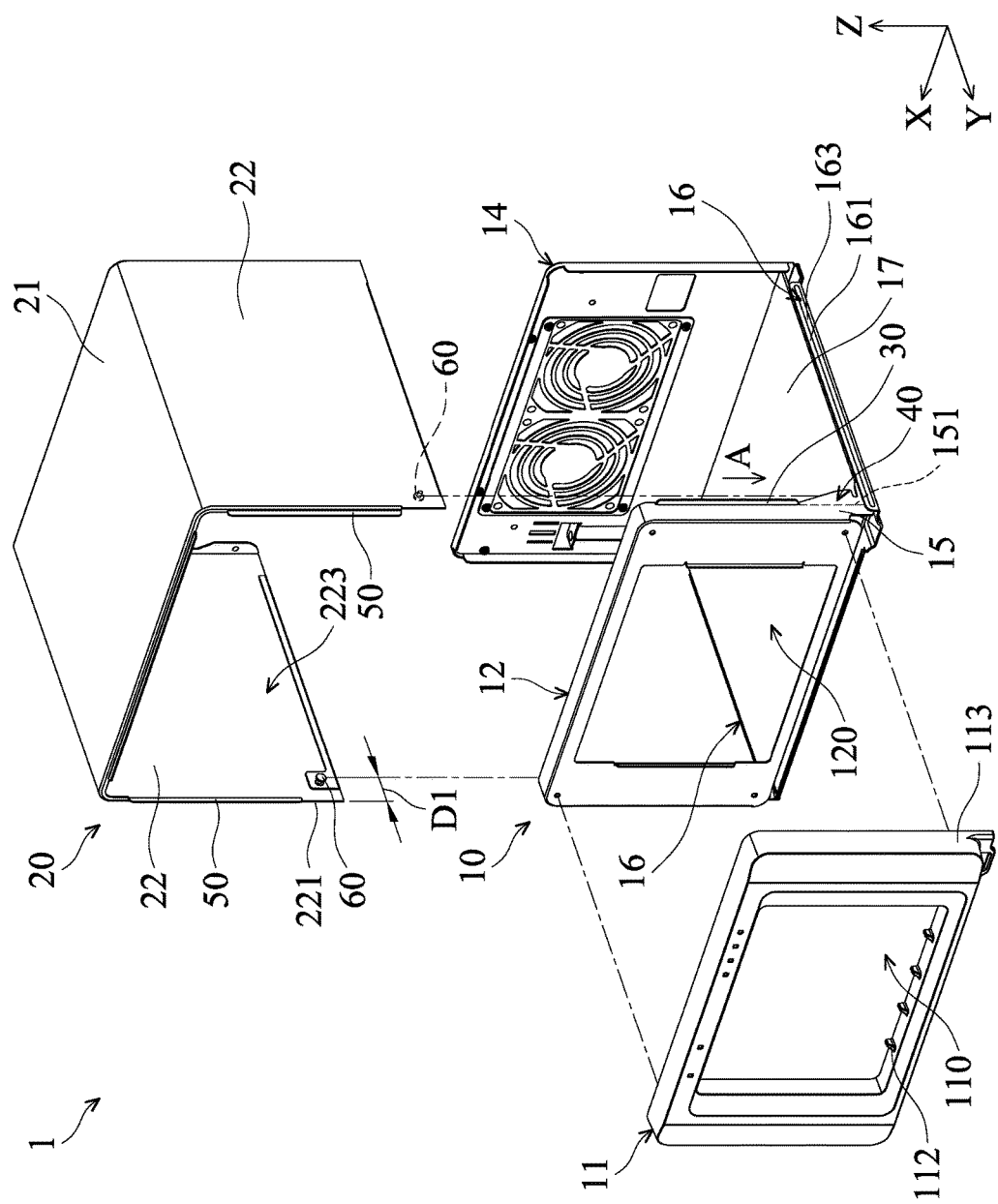
FIG. 1 is an exploded view of the electronic device in accordance with some embodiments of the present disclosure.

In the following detailed description, for purposes of explanation, numerous specific details and embodiments are set forth in order to provide a thorough understanding of the present disclosure. The specific elements and configurations described in the following detailed description are set forth in order to clearly describe the present disclosure. It will be apparent, however, that the exemplary embodiments set forth herein are used merely for the purpose of illustration, and the inventive concept may be embodied in various forms without being limited to those exemplary embodiments.

It should be noted that the elements or devices in the drawings of the present disclosure may be present in any form or configuration known to those with ordinary skill in the art. In this specification, directional expressions such as "an element is above another element or a substrate" may indicate not only that the element directly contacts another element or the substrate, but also that the element does not directly contact another element or the substrate, there being one or more another elements disposed between the element and the substrate.

In addition, in this specification, relative expressions are used. For example, "lower" or "bottom", and "higher" or "top" are used to describe the position of one element relative to another. It should be appreciated that if a device is flipped upside down, an element at a "lower" side will become an element at a "higher" side.

The terms "about" and "substantially" typically mean +/−20% of the stated value, more typically +/−10% of the stated value and even more typically +/−5% of the stated value. The stated value of the present disclosure is an approximate value. When there is no specific description, the stated value includes the meaning of "about" or "substantially".

In addition, the drawings of different embodiments may use like and/or corresponding numerals to denote like and/or corresponding elements in order to clearly describe the present disclosure. However, the use of like and/or corresponding numerals in the drawings of different embodiments does not suggest any correlation between different embodiments.

FIG. 1 is an exploded view of the electronic device 1 in accordance with some embodiments of the present disclosure. As shown in FIG. 1, the electronic device 1 includes a supporting member 10 and a case 20. The supporting member 10 and the case 20 may define an accommodating space together so as to accommodate the electronic device or other elements such as one or more hard disc drives (HDD), power suppliers, circuit boards, fans and so on. It should be understood that the number of elements of the electronic device 1 may increase, decrease or change according to practical usage requirements or the technical field to which it is applied, but the present disclosure is not limited thereto.

The case 20 and the supporting member 10 may be assembled to each other. As shown in FIG. 1, the case 20 may be assembled onto the supporting member 10 toward the −Z direction. It should be understood that in the current assembly or disassembly process of the case 20 and the supporting member 10, additional external forces are required to strain the case 20 so as to fit it to the supporting member 10. Take FIG. 1 as an example: the case 20 may include a top cover 21 and two side covers 22. The two side covers 22 are respectively coupled to two opposing side edges of the top cover 21 in the lateral direction (X direction) and are disposed perpendicular to the top cover 21. The case 20 may be an integrally formed structure. The bending portion between the top cover 21 and the side cover 22 usually has some flexibility so that the two side covers 22 of the case 20 may be expanded or bent toward two opposing sides, and thus may be conveniently or rapidly assembled or disassembled with the supporting member 10. However, such an assembly method is inefficient and may damage the case 20 after long-term use. If the assembly efficiency of the case 20 and the supporting member 10 is to be increased, additional complicated positioning structures or guiding structures will be needed, which result in an increase in the cost of producing the electronic device 1. Therefore, a simple, rapid, material saving (without additional complicated positioning structures or guiding structures being disposed), and low-cost electronic device is provided in accordance with some embodiments of the present disclosure.

In one embodiment, the supporting member 10 of the electronic device 1 may include a plurality of frames and a bottom plate 17. For example, the supporting member 10 may include a front frame 12 and a back frame 14. The front frame 12 and the back frame 14 may respectively be coupled to two opposing side edges of the bottom plate 17 in the longitudinal direction (Y direction) and thereby assemble into the main structure of the supporting member 10. It should be understood that the supporting member 10 may further include other frames in other embodiments, and that FIG. 1 is merely illustrative. In one embodiment, the front frame 12 and the back frame 14 may be parallel to each other and disposed substantially perpendicular to the bottom plate 17, but the present disclosure is not limited thereto. In another embodiment, the front frame 12 may substantially have a rectangular shape and be penetrated by an opening 120. The opening 120 may serve to provide access for the installation of electronic elements such as hard disc drives.

The supporting member 10 may include a first positioning structure 30 and a guiding structure 40. In the embodiment as shown in FIG. 1, the first positioning structure 30 and the guiding structure 40 are disposed on the front frame 12 of the supporting member 10. The guiding structure 40 is disposed on one side of the first positioning structure 30 and has a slot 48.

Figure 2:
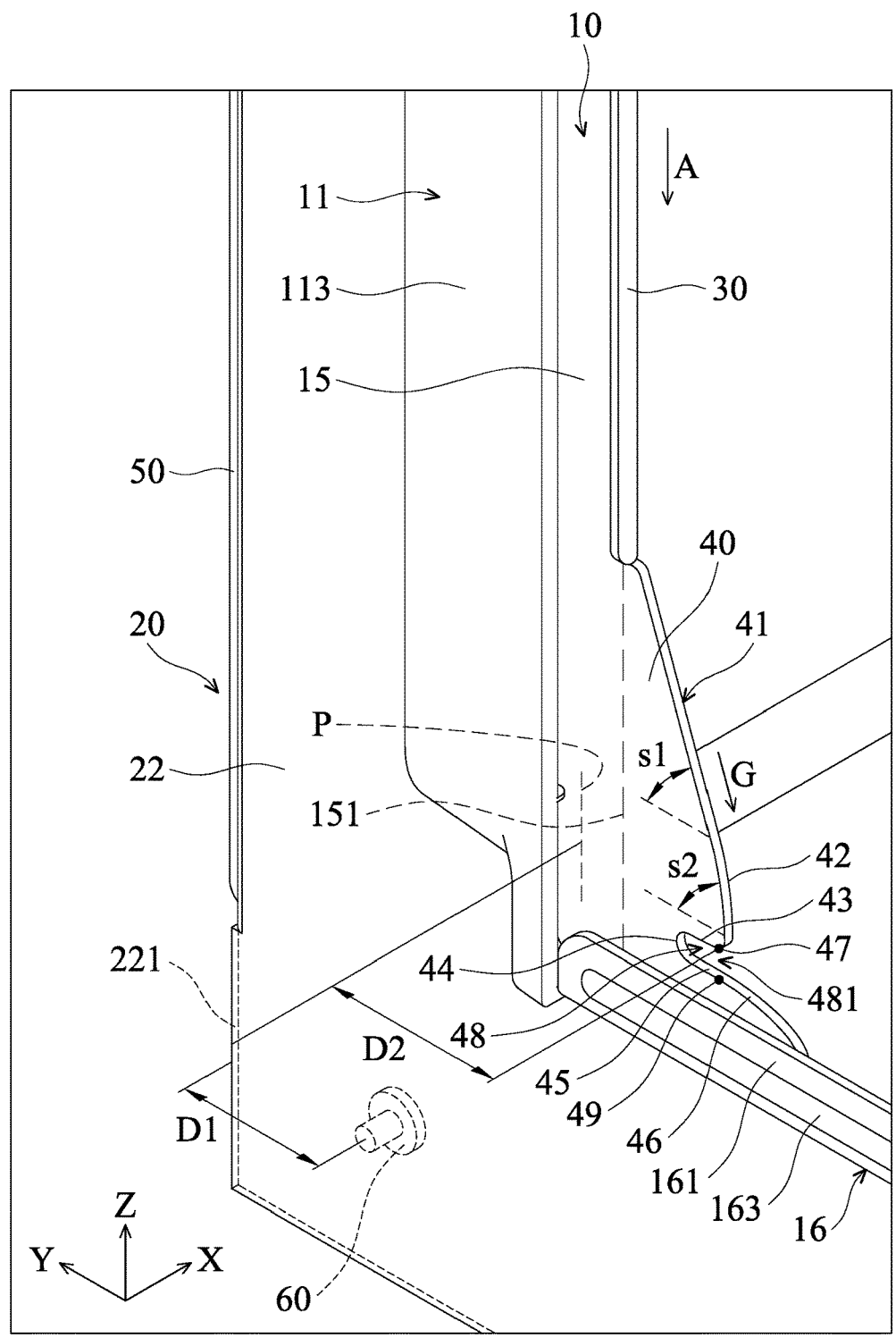
FIG. 2 is a schematic diagram showing a partial structure of the electronic device in accordance with some embodiments of the present disclosure.

Referring to FIG. 1 and FIG. 2, FIG. 2 is a schematic diagram showing the electronic device of FIG. 1 after assembly. For clarity, the case 20 is separated so that the structure and positional relationship after assembly can be easy to understand. As shown in the figures, the case 20 includes a side cover 22. The side cover 22 is disposed on one side of the supporting member 10 and includes a second positioning structure 50. According to FIG. 1 and FIG. 2, it can be understood that during the process where the case 20 is assembled to the supporting member 10, the first positioning structure 30 and the second positioning structure 50 can be against each other and slide correspondingly so that the case 20 may move forward along the assembling direction A. When assembly of the case 20 and the supporting member 10 is complete, at least a portion of the first positioning structure 30 is disposed relative to the second positioning structure 50. The phrase "at least a portion of the first positioning structure 30 is disposed relative to the second positioning structure 50" means that at least part of the first positioning structure 30 and at least part of the second positioning structure 50 are oriented face-to-face.

The electronic device 1 may further include a protrusion 60. The protrusion 60 may be disposed on the inner surface 223 of the side cover 22 of the case 20. During the assembly process, the protrusion 60 may be guided by the guiding structure 40 and change the moving direction of the case 20, thereby assisting users in assembling the case 20. After assembly, the protrusion 60 is within the slot 48. At this time, as shown in FIG. 2, the protrusion 60 and the edge 221 of the side cover 22 are spaced apart by a first distance D1. The orthogonal projection P of the edge 221 of the side cover 22 on the supporting member 10 and the opening 481 are spaced apart by a second distance D2. The first distance D1 is shorter than the second distance D2. The above edge 221 of the side cover 22 refers to the side where the side cover 22 is near the front cover 11. Since the first distance D1 is shorter than the second distance D2, it may guarantee that the protrusion 60 can be against the bottom of the slot 48 after it enters the slot 48. In this way, while the protrusion 60 is within the slot 48, it is not easy for the protrusion 60 to collide with the edge of the slot 48. It should be noted that the electronic device 1 may vibrate during the operation, and if the protrusion 60 is not held steadily against the bottom of the slot 48, it may result in noise during the operation of the electronic device 1.

Next, details of the assembling structures of the electronic device 1 are discussed in the following one or more embodiments. It should be noted that the details of the assembling structures may have other alternative structures which are different from those in the present disclosure. The details of the assembling structures may be altered according to practical usage requirements. Still referring to FIG. 1 and FIG. 2: in accordance with some embodiments of the present disclosure, the supporting member 10 may further include a side frame 15, which is disposed on the front frame 12. As shown in FIG. 1, the side frame 15 extends from the periphery of the front frame 12 toward the back frame 14 and terminates at the position of a back edge 151. In an embodiment, the side frame 15 may be disposed substantially perpendicular to the front frame 12.

The first positioning structure 30 and the guiding structure 40 are both disposed on the back edge 151 of the side frame 15. Additionally, the first positioning structure 30 may be disposed in such a way that it extends in the assembling direction A. The case 20 may slide on the supporting member 10 along the assembling direction A. The guiding structure 40 may be located in the assembling direction A of the first positioning structure 30 (from the perspective of FIG. 1, the guiding structure 40 is located below the first positioning structure 30), and the guiding structure 40 may be disposed adjacent to the first positioning structure 30. In an embodiment, "the guiding structure 40 may be disposed adjacent to the first positioning structure 30" means that the distance between the guiding structure 40 and the first positioning structure 30 is quite minimal, e.g. the distance is less than 2.5 centimeters (cm). In practical applications, the distance between the guiding structure 40 and the first positioning structure 30 may be about 0.3 millimeters (mm). In another embodiment, the guiding structure 40 may abut the first positioning structure 30 or be substantially adjoin to the first positioning structure 30. The protrusion 60 will be guided by the guiding structure 40 during the assembly process. Therefore, if the distance between the guiding structure 40 and the first positioning structure 30 is too great, e.g. greater than 2.5 centimeters, the protrusion 60 may not be successfully guided by the guiding structure 40, and it may instead become stuck between the guiding structure 40 and the first positioning structure 30.

In the embodiment as shown in FIG. 1, the electronic device 1 may substantially have two first positioning structures 30 and two guiding structures 40. The two first positioning structures 30 are disposed at two opposing sides of the front frame 12 of the supporting member 10. The two guiding structures 40 are also disposed at two opposing sides of the front frame 12 of the supporting member 10 (only one is illustrated in FIG. 1 due to the view angle). More specifically, the two first positioning structures 30 and the two guiding structures 40 may be disposed on two opposing sides of the side frame 15 so as to increase the stability of the assembly process of the case 20. It should be understood that the number of first positioning structures 30 and the number of guiding structures 40 are not limited to two. In accordance with some embodiments of the present disclosure, the number of first positioning structures 30 and guiding structures 40 may be one each, and they may be disposed at the same side of the side frame 15. Such a configuration may also achieve the effect of positioning and guiding.

In an embodiment, the electronic device 1 may further include a front cover 11. The front cover 11 may substantially have a rectangular shape and be penetrated by an opening 110. The front cover 11 may cover the front frame 12 of the supporting member 10. The opening 110 of the front cover 11 may substantially align with the opening 120 of the front frame 12. In an embodiment, the openings 110 and 120 may serve to provide access for the installation of electronic elements such as hard disc drives. In an embodiment, a plurality of spacing blocks 112 may be disposed on one side of the opening 110, and the plurality of spacing blocks 112 are spaced apart so as to guide the access of the hard disc drive, but the present disclosure is not limited thereto.

In an embodiment, the length of the side plate 113 of the front cover 11 in the longitudinal direction (Y direction) is less than the length of the side frame 15 in the longitudinal direction (Y direction). Therefore, when the front cover 11 covers the front frame 12 of the supporting member 10, the side frame 15 of the front frame 12 will not be completely covered. There is still a portion of the side frame 15 exposed outside the side plate 113 of the front cover 11. In other words, the portion of the side frame 15 that is near the front frame 12 may be covered by the side plate 113 of the front cover 11, while the back edge 151 of the side frame 15 is spaced apart from the side plate 113. Such a configuration is illustrated in FIG. 2.

In an embodiment, the first positioning structure 30 may include a first flange. The first flange may protrude from the back edge 151 of the side frame 15 toward the outside (the side facing the side cover 22 of the case 20). The first flange extends in the assembling direction A (Z direction in FIG. 1) and the extending length may be greater than half the length of the side frame 15 in the perpendicular direction (Z direction) so that the case may be guided forward in the assembling direction A by the greatest degree. However, it should be understood that the embodiments of the present disclosure may still have various types and alterations. The first positioning structure 30 may be the protruding portion that extends in the perpendicular direction (Z direction) or the trench or any other three-dimensional structures formed on the side frame 15. Moreover, the length of the first positioning structure 30 in the perpendicular direction (Z direction) may also be adjusted according to practical needs.

Figure 3A:
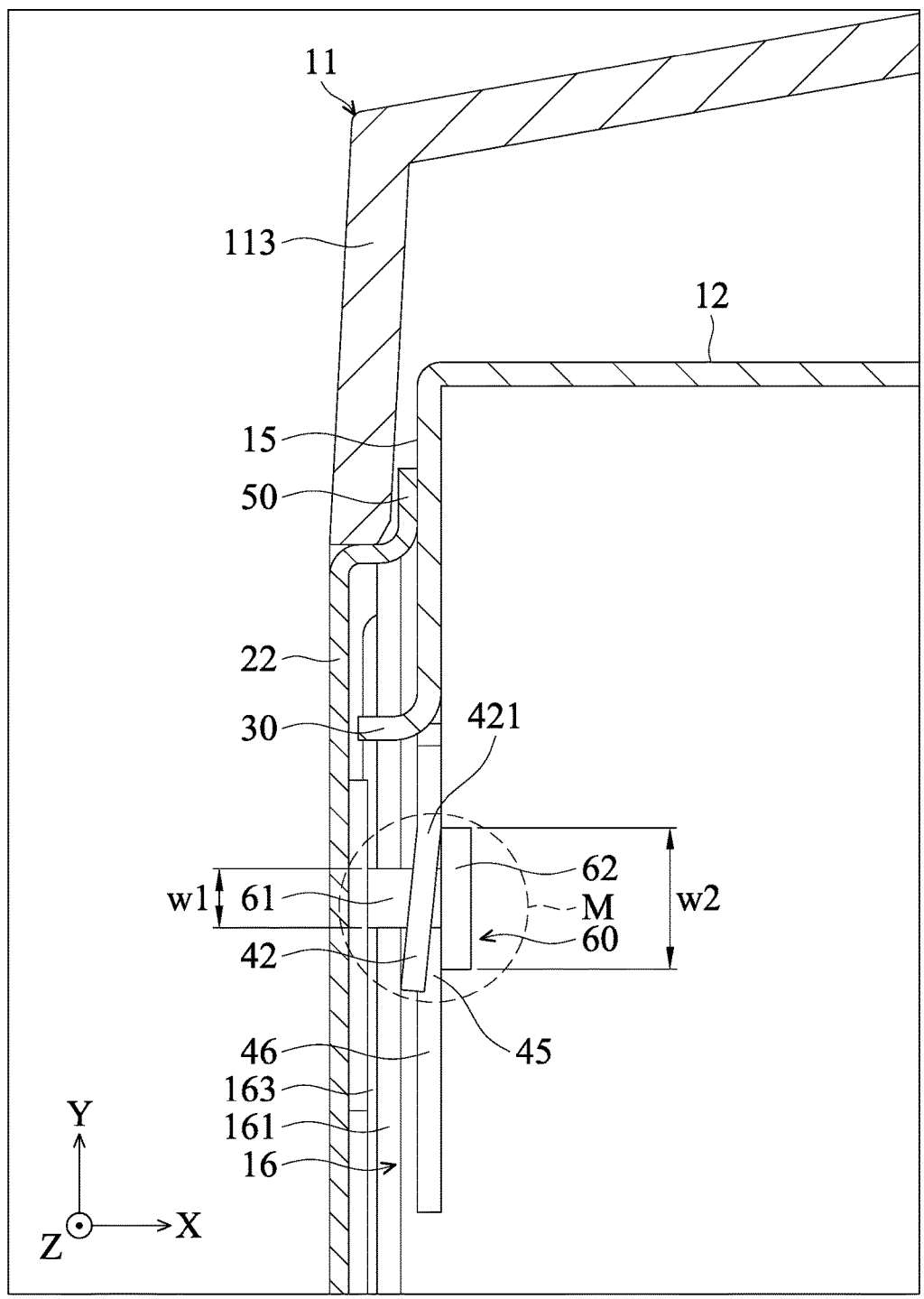
FIG. 3A is a cross-sectional view of the electronic device in accordance with some embodiments of the present disclosure.

In an embodiment, the second positioning structure 50 may include a second flange. The second flange may protrude from the edge 221 of the side cover 22 toward the side plate 113. Additionally, the second flange may extend in the assembling direction A (Z direction in FIG. 1) and the length of the second flange in the perpendicular direction (Z direction) may be greater than half the length of the side cover 22 in the perpendicular direction (Z direction). In this way, the second positioning structure 50 and the first the second positioning structure 50 may guide the case in the assembling direction A by the greatest degree. However, it should be understood that the embodiments of the present disclosure may still have various types and alterations. The length of the second positioning structure 50 in the perpendicular direction (Z direction) may also be adjusted according to practical needs. In some embodiments, as shown in FIG. 3A, the first positioning structure 30 and the second positioning structure 50 may have an L-shaped cross section and at least a portion of the first positioning structure 30 is disposed relative to the second positioning structure 50. During the process of sliding along the assembling direction A (Z direction in FIG. 3A), the first positioning structure 30 and the second positioning structure 50 may be held against each other. After the assembly process, the second positioning structure 50 leaves the first positioning structure 30, and the second positioning structure 50 is against the side plate 113 of the front cover 11.

Still referring to FIG. 1 and FIG. 2, the first positioning structure 30 and the second positioning structure 50 provide the case 20 and the supporting member 10 with convenience and stability in the assembling direction A. Next, the guiding structure 40 may guide the protrusion 60 of the case 20 forward so as to facilitate assembly of the case 20. Take FIG. 2 as an example: the guiding structure 40 may have a side edge 41. The side edge 41 may be configured to guide the movement of the protrusion 60. In an embodiment, the side edge 41 may include an askew segment 42, an upper guiding segment 43, an end segment 44, a lower guiding segment 45 and an extending segment 46, which are connected in sequence.

The askew segment 42 may extend along the guiding direction G. The guiding direction G substantially increases the distance between the askew segment 42 and the back edge 151 of the side frame 15. In other words, the distance between the askew segment 42 and the orthogonal projection P of the edge 221 of the side cover 22 on the side frame 15 is substantially increasing. The intersection point 47 of the askew segment 42 and the upper guiding segment 43 may be the position of the opening 481 of the slot 48. The distance between such a position and the back edge 151 is the second distance D2.

The askew segment 42 may be tilted with respect to the back edge 151. The tilt angle of the askew segment 42 with respect to the tilt part of the back edge 151 may remain the same. Alternatively, the tilt angle of the askew segment 42 with respect to the tilt part of the back edge 151 may be altered. For example, the portion of the askew segment 42 that is away from the upper guiding segment 43 has a first tilt angle s1, and the portion of the askew segment 42 that is near the upper guiding segment 43 has a second tilt angle s2. The second tilt angle s2 is greater than the first tilt angle s1. When the protrusion 60 is moved forward along the askew segment 42, it comes closer to the upper guiding segment 43. Therefore, since the tilt angle becomes greater (the second tilt angle s2 is greater than the first tilt angle s1), the moving speed of the protrusion 60 increases naturally, and the efficiency of assembly is increased.

Continuing to refer to FIG. 2, the upper guiding segment 43 extends from the intersection point 47 toward the back edge 151 and terminates at the end segment 44. The lower guiding segment 45 extends from the end segment 44 toward the direction that is away from the back edge 151 and terminates at the intersection point 49. The upper guiding segment 43 and the lower guiding segment 45 may be parallel to each other and spaced apart from each other. Moreover, the intersection point 47 may overlap the intersection point 49 in the top view (−Z direction). Therefore, the slot 48 may be defined by the upper guiding segment 43, the end segment 44 and the lower guiding segment 45. The slot 48 is through the main part of the guiding structure 40 in the lateral direction (X direction), and has an opening 481 on the side opposite to the end segment 44. The askew segment 42 in the side edge 41 may be disposed adjacent to the slot 48. In this way, when the protrusion 60 moves forward along the askew segment 42, it may reach the opening 481 of the slot 48 naturally. Next, the protrusion 60 may further enter the slot 48.

Figure 3B:
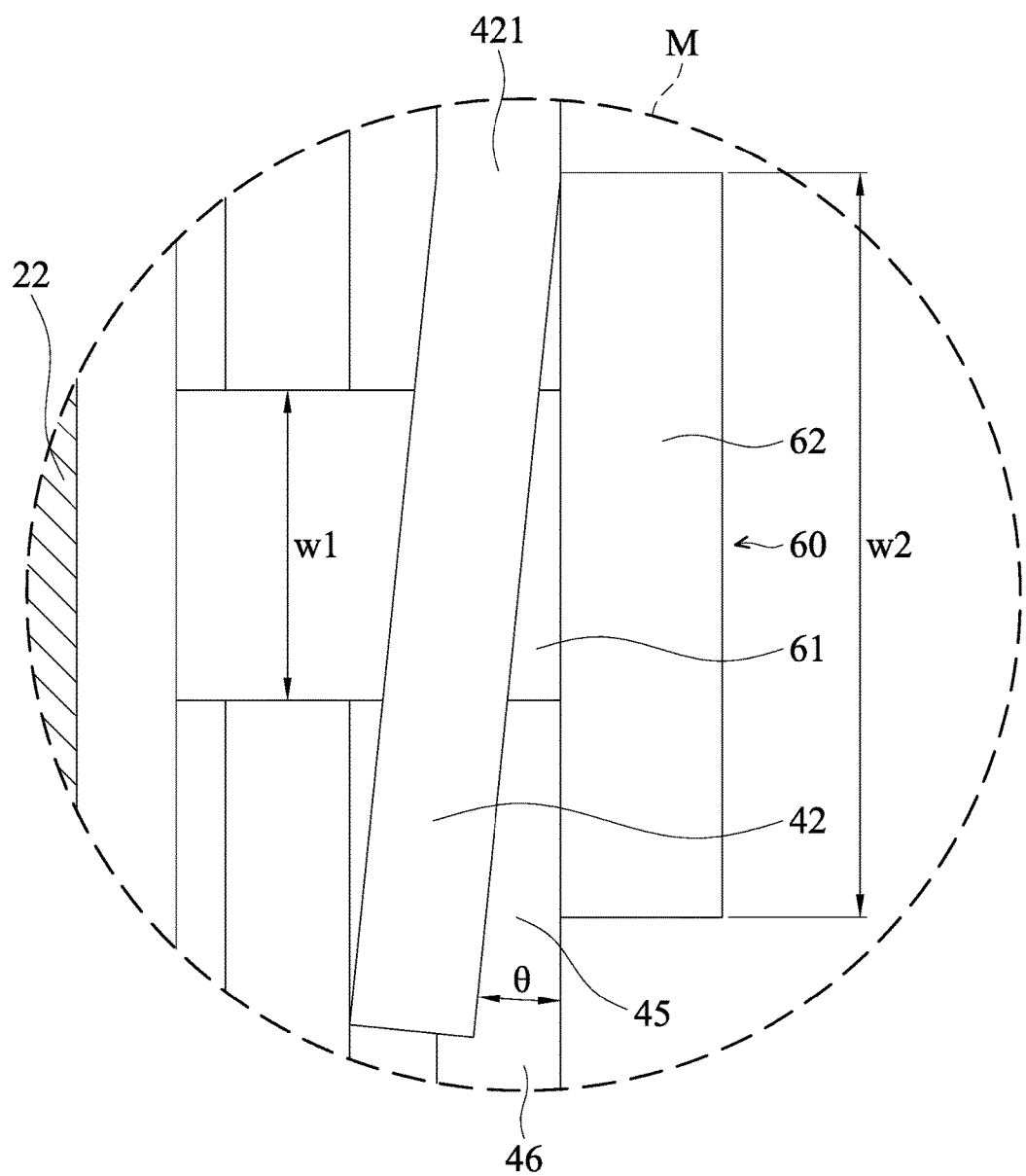
FIG. 3B is a partially enlarged figure of M region in FIG. 3A.

In an embodiment, the askew segment 42 may bend toward the side cover 22 of the case 20 at a predetermined angle θ, as shown in FIG. 3B. As such, the efficiency of assembly of the protrusion 60 entering into the slot 48 is increased. More specifically, when the protrusion 60 is located at the opening 481 of the slot 48, it becomes able to enter the slot 48 easily since the askew segment 42 is bent toward the side cover 22 of the case 20. As the protrusion 60 moves toward the inside of the slot 48, it becomes engaged with the root portion 421 of the askew segment 42 (the point where the guiding structure 40 begins to bend). Therefore, the protrusion 60 is steadily disposed within the end segment 44 of the slot 48, and will not slide freely within the slot 48. In an embodiment, the determined angle θ may range from 2 degrees to 3 degrees. However, it should be understood that the embodiments of the present disclosure may still have various types and alterations. For example, even if the determined angle θ is zero degrees, the protrusion 60 may still enter the slot 48.

Referring to FIG. 3A, the protrusion 60 may include a neck portion 61 and a head portion 62. The neck portion 61 is coupled to the side cover 22, and the head portion 62 is coupled to one end of the neck portion 61. The neck portion 61 and the head portion 62 may respectively have a circular-shaped cross section. The first width W1 of the neck portion 61 is the same as or slightly smaller than the width of the slot 48 (that is, the distance between the upper guiding segment 43 and the lower guiding segment 45, referring to FIG. 2) so that the neck portion 61 may slide within the slot 48. The second with W2 of the head portion 62 is greater than the first width W1 of the neck portion 61 so that the movement of the protrusion 60 in the lateral direction (X direction) may be limited when the protrusion 60 enters the slot 48.

The above one or more embodiments introduce the positional relationship of related structures during the process of assembling the electronic device 1. Next, the method for assembling the case 20 and the supporting member 10 of the electronic device 1 will be discussed in more detail. Referring to FIGS. 4A-4D, the method for assembling the case 20 and the supporting member 10 in accordance with some embodiments of the present disclosure is described below.

Figure 4A:
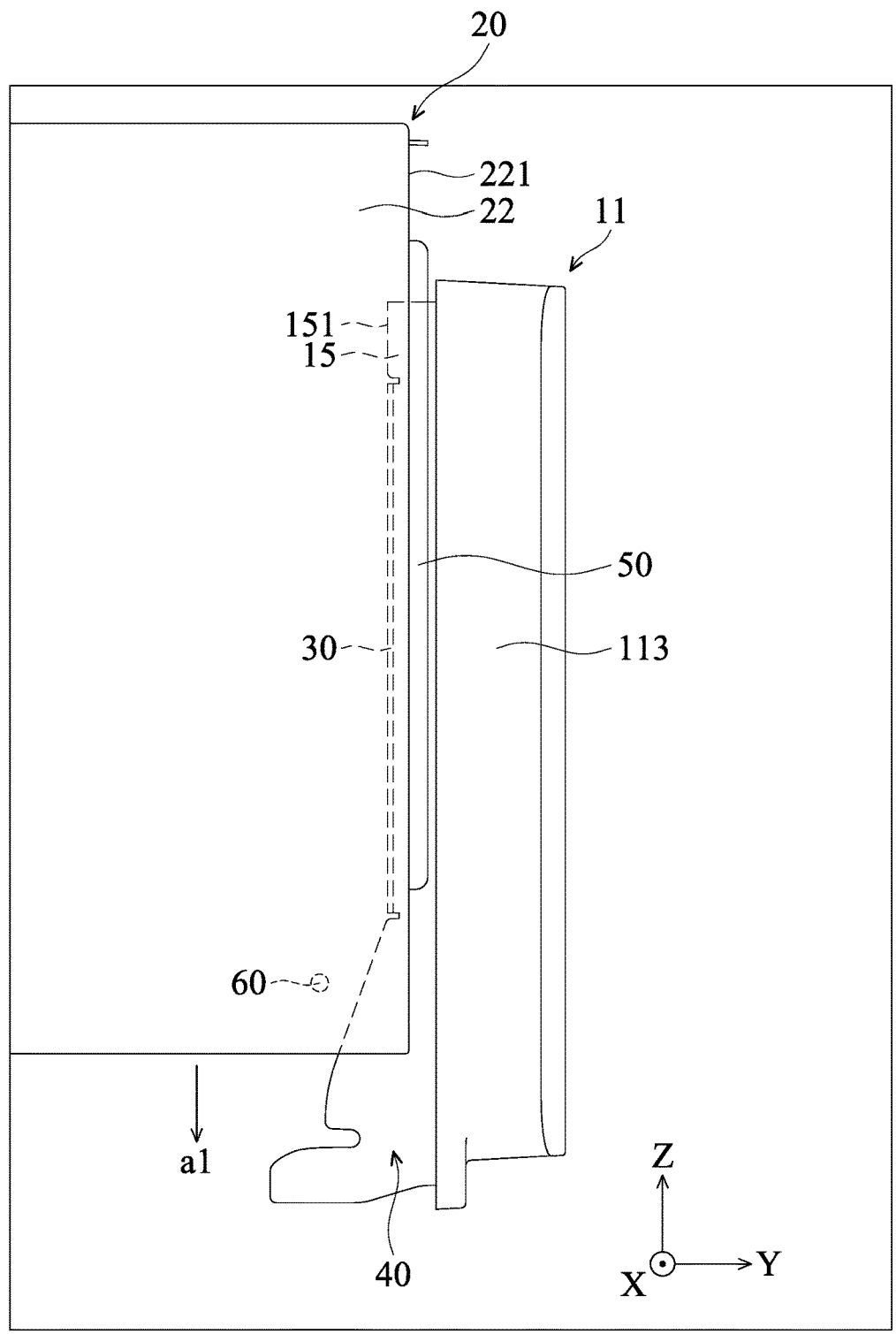
FIG. 4A is a schematic diagram showing the method for assembling the electronic device in accordance with some embodiments of the present disclosure, in which the case can be moved with respect to the front cover.
Figure 4B:
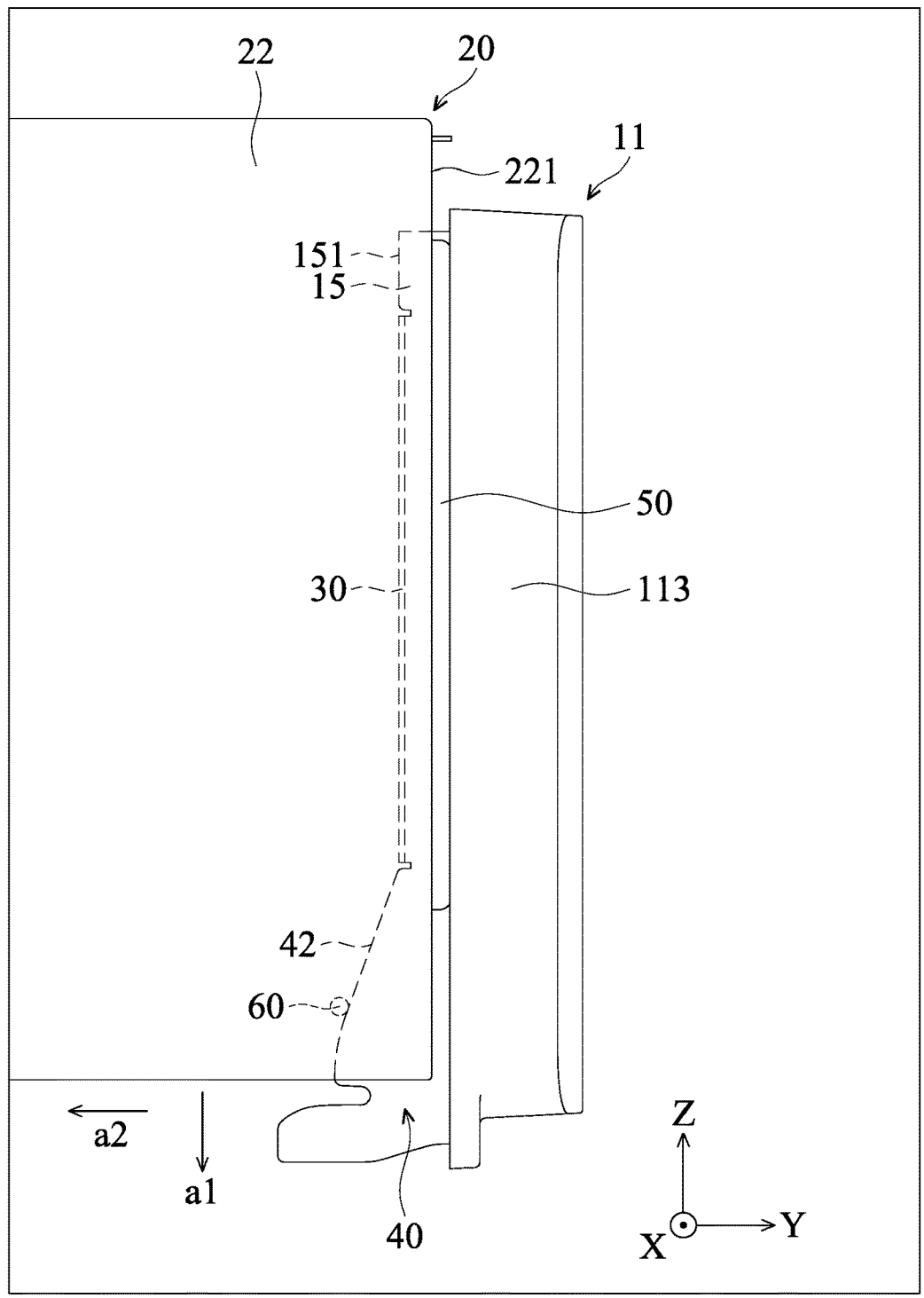
FIG. 4B is a schematic diagram showing the method for assembling the electronic device in accordance with some embodiments of the present disclosure, in which the protrusion is against the askew segment of the guiding structure.
Figure 4C:
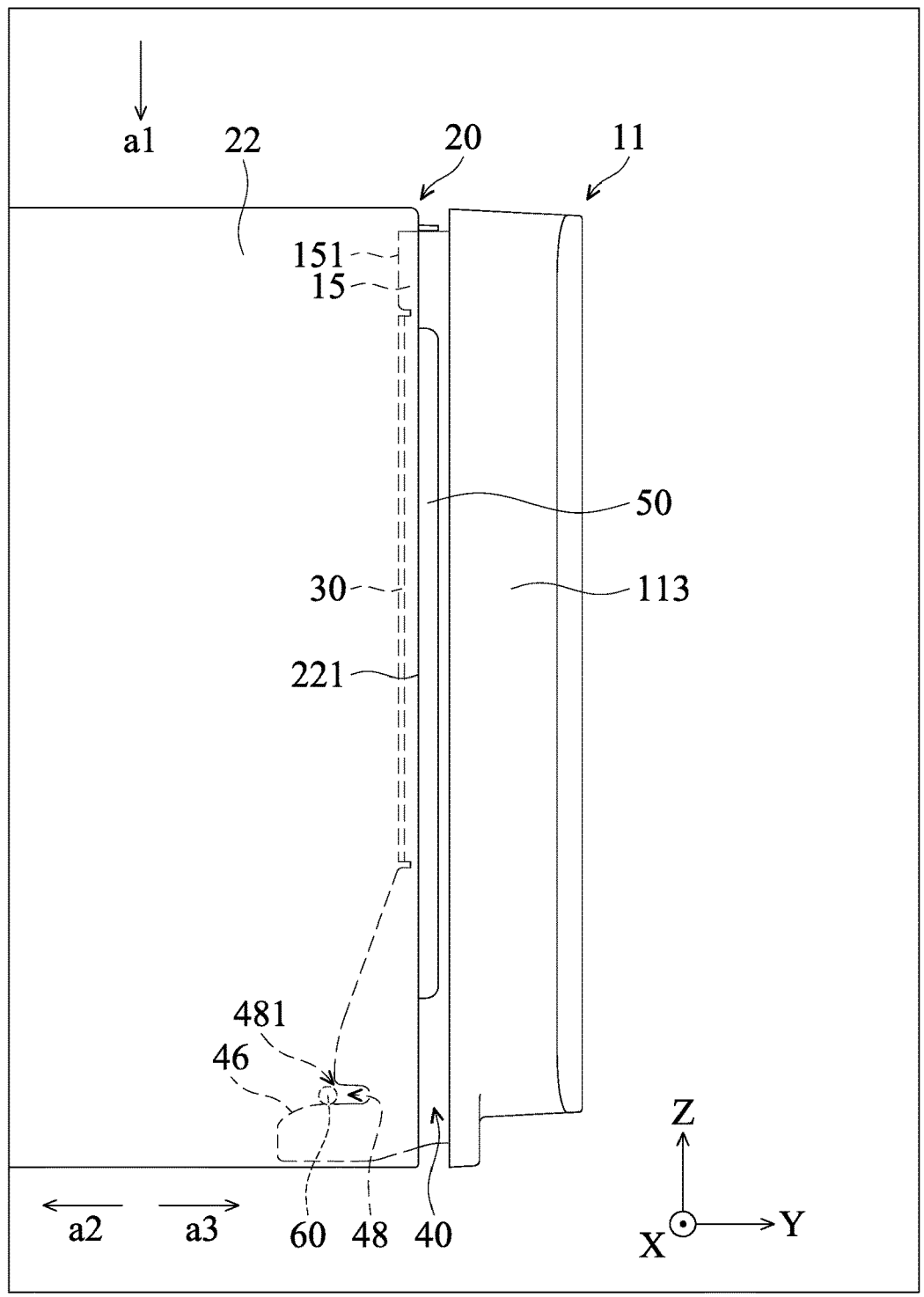
FIG. 4C is a schematic diagram showing the method for assembling the electronic device in accordance with some embodiments of the present disclosure, in which the protrusion is against the extending segment of the guiding structure.

First, referring to FIG. 4A, the portions of the two side covers 22 of the case 20 that are adjacent to the edge 221 are aligned with the outer sides of the two side frames 15 of the supporting member 10 respectively. The second positioning structure 50 is moved while attaching to the side frame 15, and the second positioning structure 50 is maintained between the first positioning structure 30 and the front cover 11. Additionally, the second positioning structure 50 may be against on the first positioning structure 30 of the supporting member 10 so as to limit the movement of the second positioning structure 50 in a direction away from the front cover 11. Moreover, the second positioning structure 50 may attach to the side frame 15 so as to limit the movement of the case 20 with respect to the supporting member 10 in the lateral direction (X direction). Next, move the case 20 along the first direction a1 so that the side cover 22 of the case 20 may move along the first direction a1 until the protrusion 60 is against the askew segment 42 of the guiding structure 40 (as shown in FIG. 4B). It should be understood that the first direction a1 herein corresponds to the assembling direction A in FIG. 1 and FIG. 2.

Next, the force along the first direction a1 is continuously applied so that the protrusion 60 is moved along the askew segment 42. The askew segment 42 is disposed tilted with respect to the back edge 151. Therefore, during the above moving process, the case 20 is moved toward the second direction a2 gradually (the second direction a2 is away from the first direction a1) until the protrusion 60 is stopped outside the opening 481 of the slot 48 and arrives at the position shown in FIG. 4C. At this time, the neck portion 61 of the protrusion 60 (as shown in FIG. 3A) is against the extending segment 46 of the guiding structure 40. In accordance with some embodiments, during the process where the askew segment 42 guides the movement of the case 20 along the second direction a2, the second positioning structure 50 will be held against the first positioning structure 30 more securely.

Next, the case 20 is moved along the third direction a3 so that the protrusion 60 may enter the slot 48. In the embodiment shown in FIG. 4C, the third direction a3 is at least partially or substantially opposite to the second direction a2, and the second direction a2 and the third direction a3 may be perpendicular to the first direction a1. When the protrusion 60 enters the slot 48, the neck portion 61 of the protrusion 60 is through the slot 48 and the head portion 62 and the side cover 22 are respectively disposed on opposite sides of the guiding structure 40 (that is, the outer side and the inner side of the guiding structure 40). At this time, since the second width W2 of the head portion 62 is greater than the first width W1 of the neck portion 61, the movement of the protrusion 60 in the lateral direction (X direction) is limited.

Figure 4D:
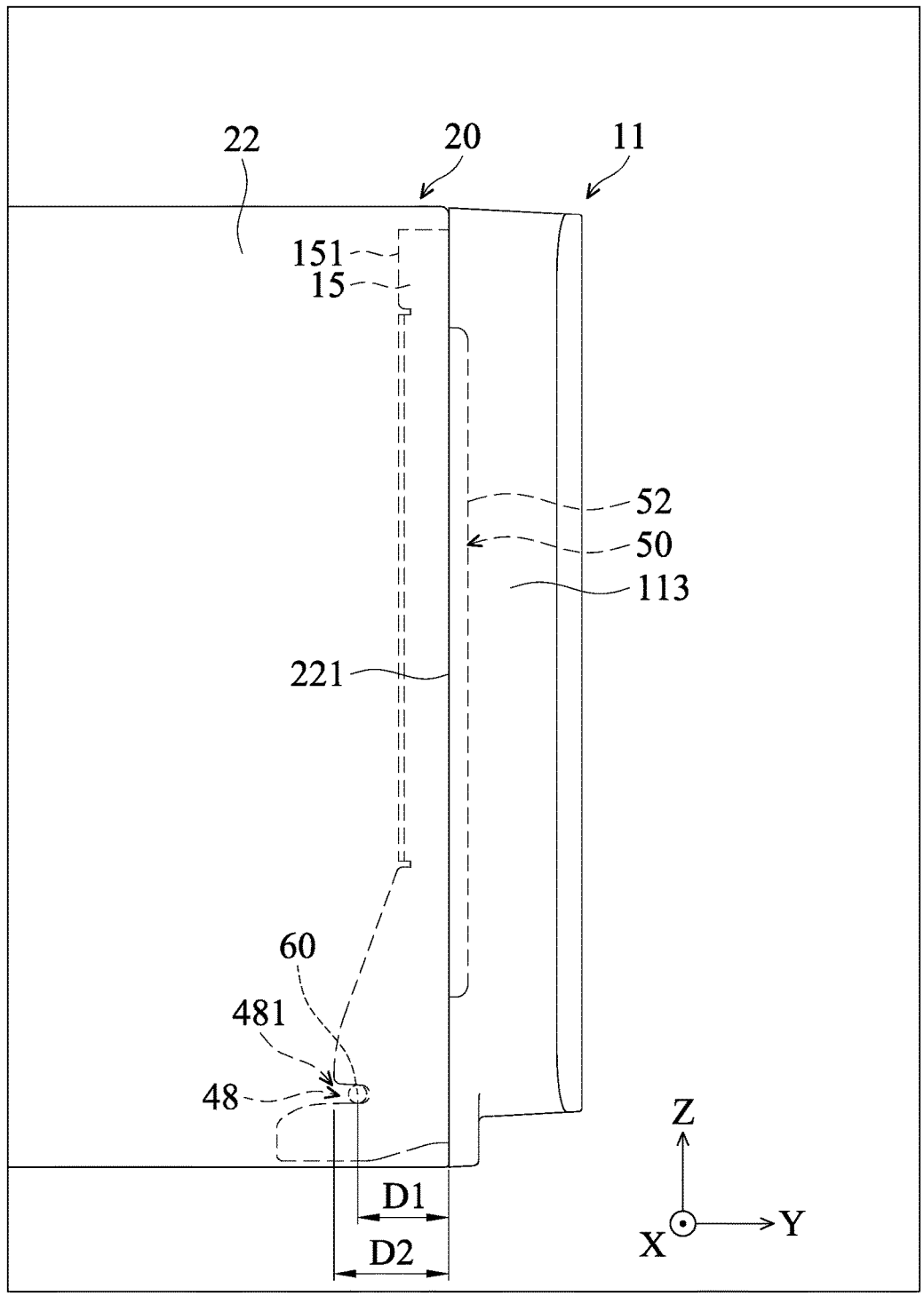
FIG. 4D is a schematic diagram showing the method for assembling the electronic device in accordance with some embodiments of the present disclosure, in which the protrusion is within the slot of the guiding structure.

Next, the case 20 is continuously moved along the third direction a3 until the edge 221 of the case 22 is held against the side plate 113 of the front cover 11, as shown in FIG. 4D. At this time, the second positioning structure 50 may be stuck in the gap between the side frame 15 and the side plate 113 (referring to FIG. 3A) so that the case 20 is fixed with respect to the supporting member 10.

As shown in FIG. 4D, the first distance D1 between the protrusion 60 and the edge 221 is shorter than the second distance D2 between the orthogonal projection P of the edge 221 on the supporting member 10 and the opening 481 of the slot 48 (referring to FIG. 2). Therefore, the protrusion 60 may move along the slot 48 in a determined route. The user may know that the assembly method is about to be completed by this step.

On the other hand, as shown in FIG. 3B, the askew segment 42 is bent and extended toward the side cover 22. The head portion 62 of the protrusion 60 and the askew segment 42 are not tightly attached to each other at the positions where the protrusion 60 is adjacent to the opening 481 of the slot 48. Therefore, the resistance of the protrusion 60 while changing directions from the second direction a2 to the third direction a3 can be decreased. However, during the process where the neck portion 61 of the protrusion 60 enters the slot 48 along the third direction a3 (FIG. 4C), the head portion 62 of the protrusion 60 and the askew segment 42 become closer and attach to each other tightly. The friction between the head portion 62 and the askew segment 42 is increasing. Accordingly, during the process where the protrusion 60 enters the slot 48, the user may also be aware of the increasing friction and know whether the assembling process is complete or not.

Figure 5:
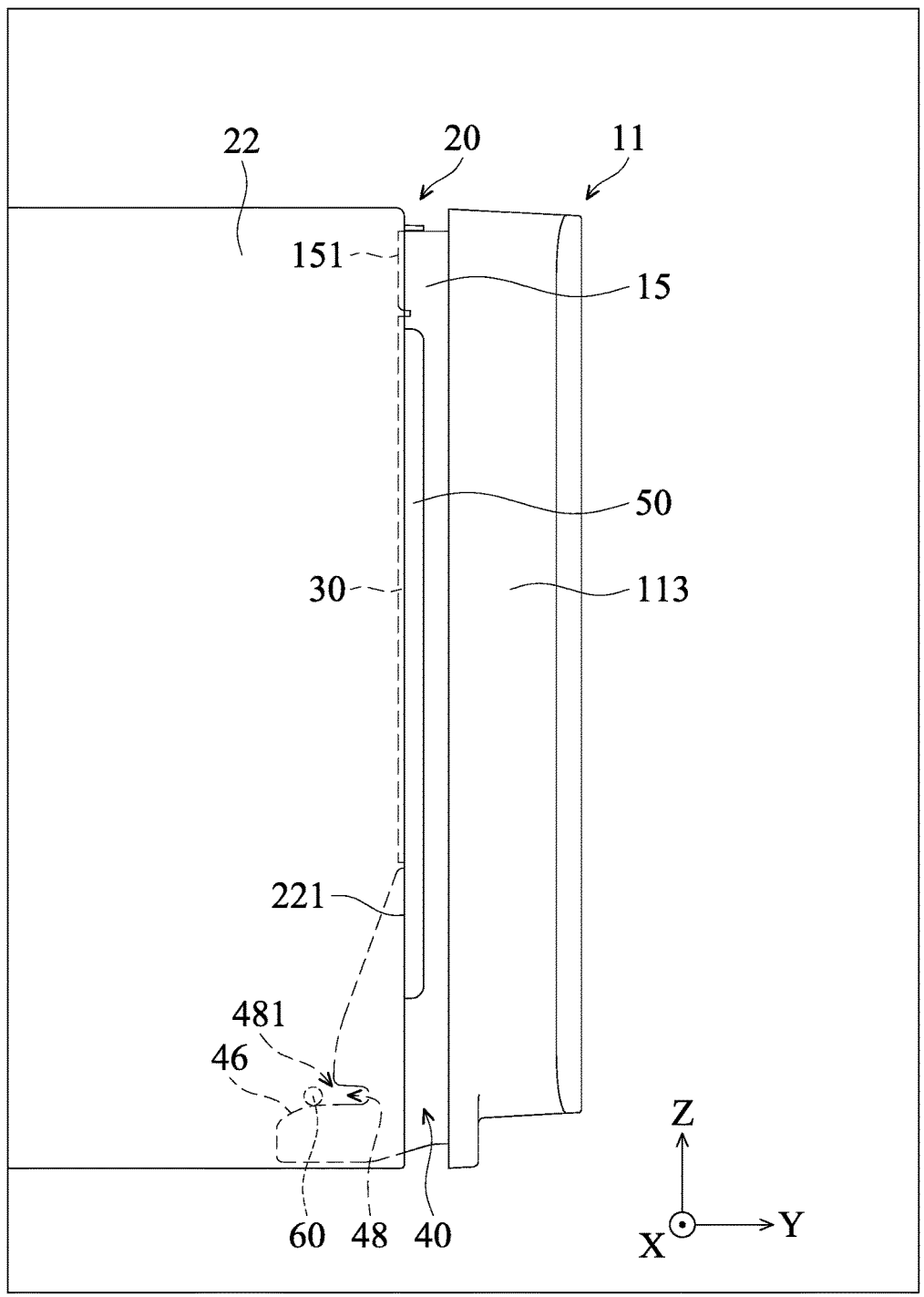
FIG. 5 is a schematic diagram showing the method for assembling the electronic device in accordance with some embodiments of the present disclosure, in which the first positioning structure of the case is against the second positioning structure of the supporting member.

In the various embodiments as described above, the first positioning structure 30 and the second positioning structure 50 of the electronic device enable the user to rapidly locate the position of the case 20 with respect to the supporting member 10, and thus improve the efficiency of assembly. Additionally, the configuration of the first positioning structure 30 and the second positioning structure 50 also ensure that the protrusion 60 may be positioned within the extending segment 46 of the guiding structure 40, and thus may prevent the protrusion 60 from deforming or falling off during the process where the protrusion 60 is inserted into the slot 48. Specifically, as shown in FIG. 5, when the case 20 is lowered, as long as the second positioning structure 50 is located between the back edge 151 of the side frame 15 and the side plate 113, the protrusion 60 can be lowered to the extending segment 48 of the guiding structure 40, even if the second positioning structure 50 is against the first positioning structure 30. Therefore, the protrusion 60 will not be located outside the guiding structure 40, thereby increasing the stability of the assembly.

Referring back to FIG. 1 and FIG. 2, in an embodiment, the electronic device 1 may further include two spacing members 16, which are coupled to the two opposing side edges of the bottom plate 17 in the lateral direction (X direction) respectively. The two spacing members 16 each include a substrate 161 and a protruding portion 163. The two substrates 161 are appendicular to the bottom plate 17. The two protruding portions 163 are disposed on the outer surfaces of the two substrates 161 (the surfaces that are adjacent to the side frame 15) respectively. The protruding portions 163 protrude from the corresponding substrates 161. The length of the protruding portions 163 in the longitudinal direction (Y direction) may be slightly less than the length of the substrate 161 in the longitudinal direction (Y direction).

It should be understood that, in accordance with the embodiment shown in FIG. 1, although the protruding portion 163 extends from one end of the substrate 161 to the other end of the substrate 161, the present disclosure is not limited thereto. In other embodiments, the protruding portion 163 may include a plurality of subparts in the longitudinal direction (Y direction) which are arranged at intervals. The materials of the protruding portion 163 and the substrate 161 may be different. For example, the materials of the substrate 161 may include metals, and the materials of the protruding portion 163 may include flexible materials such as rubber. However, it should be understood that the embodiments of the present disclosure may still have various types and alterations. The materials of the protruding portion 163 and the substrate 161 may be the same. After the case 20 is assembled to the supporting member 10, the inner surface of the side cover 22 is attached to the protruding portion 163 since the lower edge of the side cover 22 does not have a bending portion. In this way, the noise of the resonance resulted from the case 20 and the supporting member 10 may be decreased.

In an embodiment, the supporting member 10, the first positioning structure 30, the guiding structure 40, the front cover 12, and the side frame 15 may be integrally formed. Assembly of the case 20 can be completed successfully without disposing additional complex positioning structures or guiding structures. An easy, rapid, material-saving and low-cost method for assembling the electronic device is therefore provided Although some embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. An electronic device, comprising:
    a supporting member comprising:
        a first positioning structure; and
        a guiding structure positioned on one side of the first positioning structure, wherein the guiding structure has a slot;
    a side cover positioned on one side of the supporting member and comprising:
        a second positioning structure, wherein at least a portion of the first positioning structure is disposed relative to the second positioning structure; and
    a protrusion disposed on the side cover and located within the slot, wherein the protrusion and an edge of the side cover are spaced apart by a first distance, and wherein an orthogonal projection of the edge of the side cover on the supporting member and an opening of the slot are spaced apart by a second distance, and the first distance is shorter than the second distance.

2. The electronic device as claimed in claim 1, wherein the protrusion comprises:
    a neck portion coupled to the side cover and having a first width which is smaller than a width of the slot; and
    a head portion coupled to an end of the neck portion which is away from the side cover and having a second width which is greater than the first width, wherein the neck portion passes through the slot, and the head portion and the side cover are positioned on opposite sides of the guiding structure.

3. The electronic device as claimed in claim 1, wherein the guiding structure has a side edge, and the side edge is configured to guide the movement of the protrusion and comprises:
    an upper guiding segment;
    a lower guiding segment facing the upper guiding segment, wherein the slot is positioned between the upper guiding segment and the lower guiding segment; and
    an extending segment coupled to an end of the lower guiding segment which is adjacent to the opening of the slot.

4. The electronic device as claimed in claim 1, wherein the guiding structure has a side edge, which is configured to guide the movement of the protrusion and comprises an askew segment disposed adjacent to the slot, wherein the askew segment is bent toward the side cover at a predetermined angle.

5. The electronic device as claimed in claim 4, wherein the predetermined angle is from about 2 degrees to about 3 degrees.

6. The electronic device as claimed in claim 1, wherein the guiding structure has a side edge, which is configured to guide the movement of the protrusion and comprises an askew segment disposed adjacent to the slot, wherein in a direction toward the slot, a distance between the askew segment and the orthogonal projection of the edge of the side cover on the supporting member increases.

7. The electronic device as claimed in claim 1, wherein the first positioning structure comprises a first flange and the second positioning structure comprises a second flange, wherein the first flange protrudes from the supporting member toward the side cover and the second flange protrudes from the side cover toward the supporting member, and wherein at least a portion of the first flange is disposed relative to the second flange.

8. The electronic device as claimed in claim 1, wherein the first positioning the assembling direction, and wherein the guiding structure is disposed adjacent to the first positioning structure.

9. The electronic device as claimed in claim 1, further comprising a spacing block positioned between the supporting member and the side cover so that the supporting member and the side cover are spaced apart.

10. The electronic device as claimed in claim 1, wherein the supporting member, the first positioning structure and the guiding structure are integrally formed.

11. An electronic device, comprising:
    a supporting member;
    a first positioning structure disposed on the supporting member;
    a guiding structure disposed on the supporting member and positioned on one side of the first positioning structure, wherein the guiding structure has an askew segment and a slot, the askew segment extends in a guiding direction, and an opening of the slot is positioned in the guiding direction;
    a side cover positioned on one side of the supporting member;
    a second positioning structure disposed on the side cover, wherein at least a portion of the first positioning structure is disposed relative to the second positioning structure; and
    a protrusion is disposed on the side cover and positioned within the slot.

12. The electronic device as claimed in claim 11, wherein the protrusion comprises:

a neck portion coupled to the side cover and having a first width which is smaller than a width of the slot; and a head portion coupled to an end of the neck portion which is away from the side cover and having a second width which is greater than the first width, wherein the neck portion passes through the slot, and the head portion and the side cover are positioned on opposite sides of the guiding structure.

13. The electronic device as claimed in claim 12, wherein the askew segment is disposed adjacent to the slot and is bent toward the side cover at a predetermined angle, and the askew segment and the slot are configured to guide the movement of the protrusion.

14. The electronic device as claimed in claim 13, wherein the predetermined angle is from about 2 degrees to about 3 degrees.

15. The electronic device as claimed in claim 11, wherein the guiding structure has a side edge, and the side edge is configured to guide the movement of the protrusion and comprises:

an upper guiding segment;

a lower guiding segment facing the upper guiding segment, wherein the slot is positioned between the upper guiding segment and the lower guiding segment; and an extending segment coupled to an end of the lower guiding segment which is adjacent to the opening of the slot.

16. The electronic device as claimed in claim 11, wherein the first positioning structure comprises a first flange and the second positioning structure comprises a second flange, wherein the first flange protrudes from the supporting member toward the side cover and the second flange protrudes from the side cover toward the supporting member, and wherein at least a portion of the first flange is positioned relative to the second flange.

17. The electronic device as claimed in claim 11, further comprising a spacing block positioned between the supporting member and the side cover so that the supporting member and the side cover are spaced apart.

18. The electronic device as claimed in claim 11, wherein the supporting member, the first positioning structure and the guiding structure are integrally formed.

19. A method for assembling a case of an electronic device, wherein the electronic device comprises a supporting member and the case comprises a side cover, and the method comprises:

moving the side cover along a first direction so that a second positioning structure which is disposed on the side cover is against a first positioning structure on the supporting member;

continuously moving the side cover along the first direction so that a protrusion which is disposed on the side cover is against a guiding structure on the supporting member, and moving the side cover toward a second direction until the protrusion is stopped at a position outside an opening of a slot of the guiding structure, and wherein the second direction is away from the first direction; and moving the side cover along a third direction so that the protrusion is moved within the slot, wherein the third direction is at least partially opposite the second direction.

20. The method as claimed in claim 19, wherein an askew segment of the guiding structure is bent toward the side cover at a predetermined angle so that the frictional force increases when the protrusion is moved along the third direction.

* * * * *